(12) United States Patent
Lee et al.

(10) Patent No.: US 7,396,772 B2
(45) Date of Patent: Jul. 8, 2008

(54) METHOD FOR FABRICATING SEMICONDUCTOR DEVICE HAVING CAPACITOR

(75) Inventors: Sang-Do Lee, Ichon-shi (KR);
Sun-Woong Na, Ichon-shi (KR);
Dong-Ryeol Lee, Ichon-shi (KR);
Dong-Goo Choi, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/582,638

(22) Filed: Oct. 17, 2006

(65) Prior Publication Data

US 2007/0281480 A1  Dec. 6, 2007

(30) Foreign Application Priority Data

May 30, 2006 (KR) .................. 10-2006-0049007

(51) Int. Cl.
*H01L 21/302* (2006.01)
(52) U.S. Cl. .................. 438/706; 438/700; 438/723
(58) Field of Classification Search .............. 438/700, 438/706, 712, 714, 723, 724, 725
See application file for complete search history.

(56) References Cited

U.S. PATENT DOCUMENTS 6,451,651 B1*  9/2002  Park et al. .................. 438/253
2001/0015452 A1*  8/2001  Shinkawata .................. 257/306
2001/0046737 A1*  11/2001  Ahn et al. .................. 438/253
2002/0119623 A1*  8/2002  Park et al. .................. 438/253
2005/0048717 A1*  3/2005  Ito et al. .................. 438/253
2006/0211192 A1*  9/2006  Cho et al. .................. 438/238

FOREIGN PATENT DOCUMENTS

| KR | 1999-0055805 | 7/1999 |
| KR | 100233559 B1 | 9/1999 |
| KR | 1020000072953 A | 12/2000 |
| KR | 1020010057669 A | 7/2001 |

* cited by examiner

*Primary Examiner*—Kin-Chan Chen
(74) *Attorney, Agent, or Firm*—Townsend and Townsend and Crew LLP

(57) ABSTRACT

A method for fabricating a semiconductor device includes: providing a substrate structure including a bit line and a capacitor formed apart from each other at a different level; forming first, second, and third insulation layers over the bit line, the second insulation layer being a first etch stop layer; forming a second etch stop layer over a top electrode of the capacitor; forming a fourth insulation layer over the third insulation layer and the second etch stop layer; and performing a plurality of etch steps to expose an upper surface of the bit line and an upper surface of the capacitor.

18 Claims, 7 Drawing Sheets

FIG. 1
(RELATED ART)
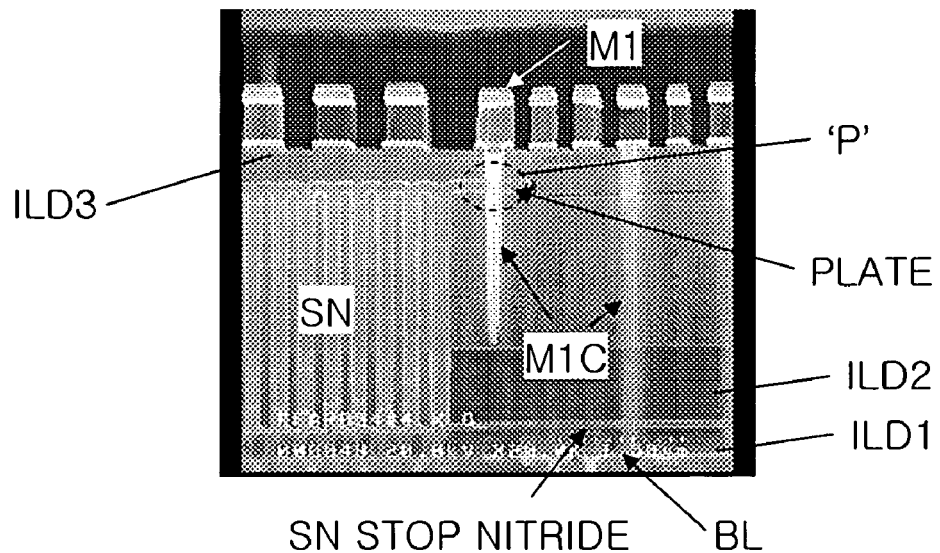
FIG. 2A
(RELATED ART)
FIG. 2B
(RELATED ART)
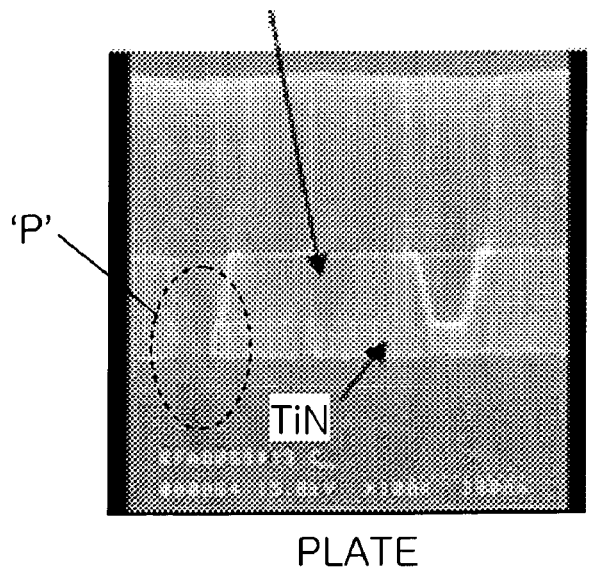
PLATE
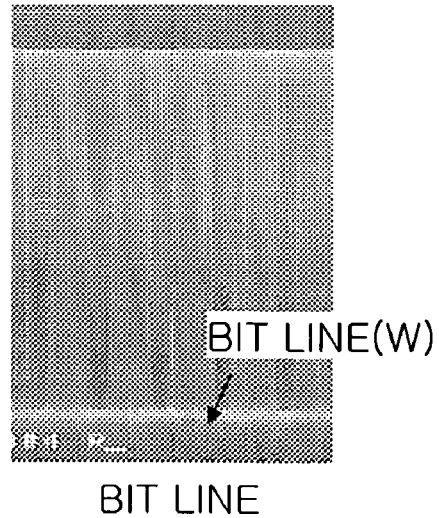
BIT LINE

PLATE

BIT LINE

METHOD FOR FABRICATING SEMICONDUCTOR DEVICE HAVING CAPACITOR

BACKGROUND

The present invention relates to a method for fabricating a semiconductor device; and more particularly, to a method for fabricating a final metal contact of a dynamic random access memory (DRAM) device having a cylinder type capacitor.

Since dynamic random access memory (DRAM) devices have a high capacitance and can freely input and output data, the DRAM devices have been widely used. Each of the DRAM devices includes an access transistor and a cumulative capacitor. The data signal is received from the top electrode and bit line of the capacitor from an external circuit through a final metal contact.

FIG. 1 is a scanning electron microscope (SEM) micrograph illustrating a cross-sectional view of a typical DRAM device including a final metal contact.

A first inter-layer insulation layer ILD1 covering a bit line BL is formed over a substrate completed with a bit line formation process. Afterwards, a nitride-based etch stop layer SN STOP NITRIDE and a second inter-layer insulation layer ILD2 for forming a capacitor are formed over the first inter-layer insulation layer ILD1. Then, predetermined portions of the second inter-layer insulation layer ILD2 and the nitride-based etch stop layer SN STOP NITRIDE are selectively etched to form a plurality of contact holes (not shown). Thereafter, a plurality of bottom electrodes (i.e., storage nodes SN) of the capacitor are formed only inside the contact holes (not shown) The second inter-layer insulation layer ILD2 and the nitride-based etch stop layer SN STOP NITRIDE between the bottom electrodes are selectively removed. Accordingly, a plurality of cylinder type storage nodes SN, which are electrically isolated from each other, are formed in a region where the capacitors are to be formed.

A dielectric layer (not shown) is formed over the height difference of the second inter-layer insulation layers ILD2 and the storage nodes SN. A plate electrode PLATE, which is the top electrode of the capacitor, is formed over the dielectric layer to fill a plurality of empty spaces between the storage nodes SN. Accordingly, a DRAM cell capacitor is completed. Afterwards, an amorphous silicon (a-Si) layer (or a polysilicon layer) having different etch selectivity from the plate electrode PLATE is formed over the plate electrode PLATE as a passivation layer to protect the plate electrode PLATE.

Predetermined portions of the amorphous silicon (a-Si) layer, the plate electrode PLATE, and the dielectric layer are selectively etched; then a third inter-layer insulation layer ILD3 is formed over the resulting structure.

An etching process using a mask is performed to form a plurality of metal contacts M1C exposing predetermined upper portions of the plate electrode PLATE and the bit line BL.

However, while the etching process exposing the upper portion of the bit line BL is performed by using the identical etch gas (e.g., a mixture gas of $C_4F_6$, Ar and $O_2$) used through the mask, a punch-through phenomenon 'P' in which a cavity is formed in the plate electrode PLATE may be produced. Since the depth from the third inter-layer insulation layer ILD3 to the upper portion of the bit line BL is greater than the depth from the third inter-layer insulation layer ILD3 to the upper portion of the plate electrode PLATE, the etching process to form the metal contacts M1C exposing the upper portion of the bit line BL continues even after the metal contacts M1C exposing the upper portion of the plate electrode PLATE is formed. Herein, reference denotation M1 denotes a final metal interconnection line.

FIGS. 2A and 2B are SEM micrographs illustrating a punch-through phenomenon typically produced within a titanium nitride (TiN) layer forming a top electrode (i.e., a plate electrode) of a capacitor. FIG. 2A illustrates a portion where the top electrode of the capacitor is exposed, and FIG. 2B illustrates a portion where a bit line is exposed.

As described above, if the punch-through phenomenon 'P' is produced in the plate electrode, the contact area between the final metal interconnection line (to be subsequently formed) and the plate electrode is reduced. Thus, the contact resistance between the metal interconnection line and the plate electrode may be increased.

SUMMARY OF THE INVENTION

The present invention relates to a method for fabricating a semiconductor device capable of reducing the contact resistance between a metal contact and a top electrode of a capacitor. This is done by preventing a punch-through phenomenon, which produces a cavity in the top electrode of the capacitor, during the etching process to form the metal contact which is electrically connected to the top electrode of the capacitor and a bit line.

In accordance with one embodiment of the present invention, there is provided a method for fabricating a semiconductor device, including: providing a substrate structure including a bit line and a capacitor formed apart from each other at a different level; forming first, second, and third insulation layers over the bit line, the second insulation layer being a first etch stop layer; forming a second etch stop layer over a top electrode of the capacitor; forming a fourth insulation layer over the third insulation layer and the second etch stop layer; and performing a plurality of etch steps to expose an upper surface of the bit line and an upper surface of the capacitor.

In accordance with another embodiment of the present invention, there is provided a method for fabricating a semiconductor device, including: providing a substrate structure including a bit line and a capacitor formed apart from each other at a different level, wherein first, second, and third insulation layers are formed over the bit line, the second insulation layer being a first etch stop layer; forming a second etch stop layer over a top electrode of the capacitor; forming a fourth insulation layer over the third insulation layer and the second etch stop layer; etching the fourth insulation layer to expose a portion of the second etch stop layer and a portion of the third insulation layer; etching the third insulation layer until the first etch stop layer is exposed; etching the first etch stop layer and the first insulation layer until an upper surface of the bit line is exposed using an etch gas having high selectivity to the second etch stop layer; and etching the second etch stop layer until the top electrode is exposed using an etch gas having high selectivity to the top electrode.

BRIEF DESCRIPTION OF THE DRAWINGS

The present invention will become better understood with respect to the following description of the embodiments given in conjunction with the accompanying drawings, in which:

FIG. 1 is a scanning electron microscope SEM micrograph illustrating a typical dynamic random access memory (DRAM) device;

FIGS. 2A and 2B are SEM micrographs illustrating a punch-through phenomenon typically generated in a top electrode of a capacitor of a typical DRAM device;

DETAILED DESCRIPTION OF THE INVENTION

Figure 3:
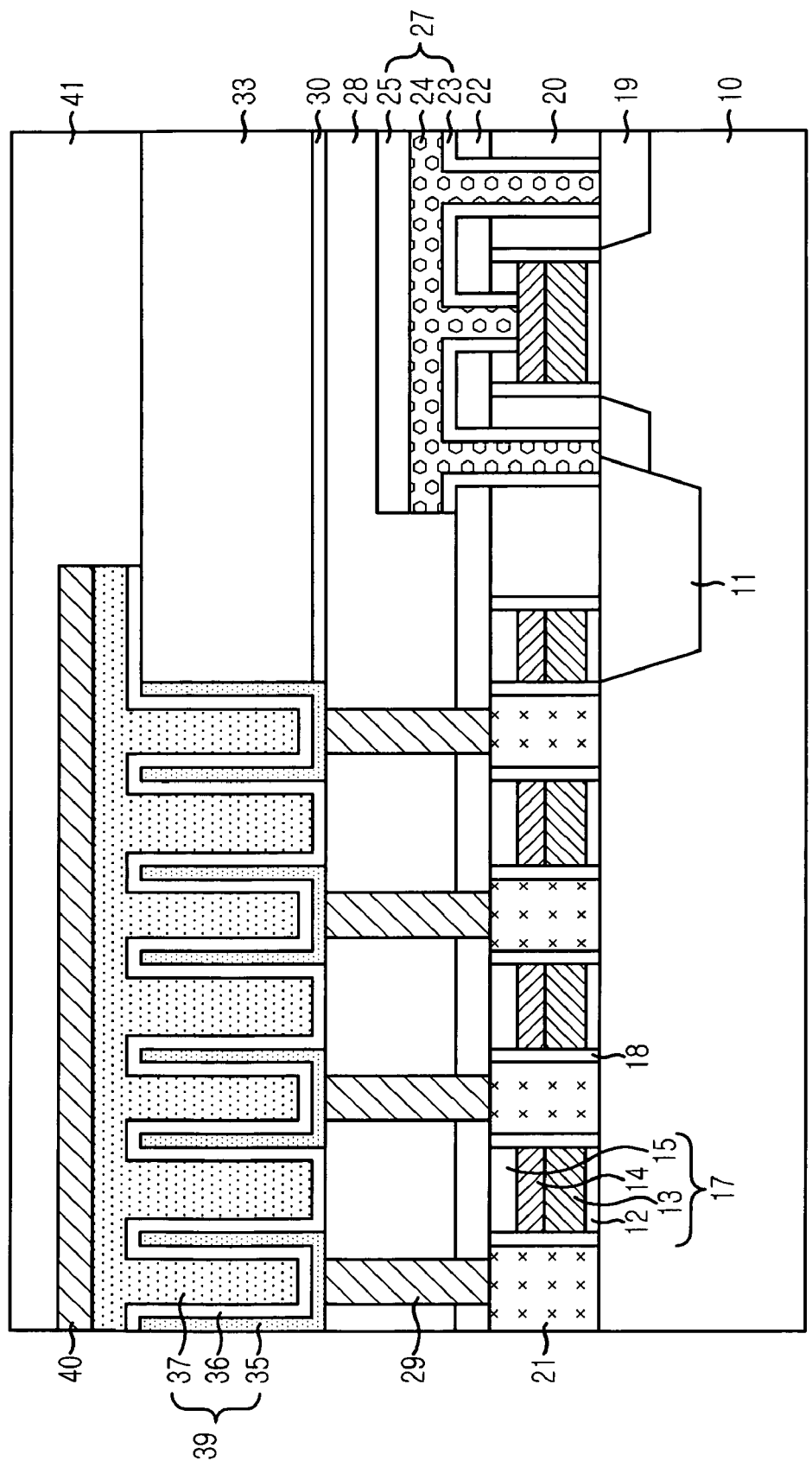
FIGS. 3 to 7 are cross-sectional views illustrating a method for fabricating a semiconductor device including a capacitor in accordance with an embodiment of the present invention.

Hereinafter, detailed descriptions on certain embodiments of the present invention will be provided with reference to the accompanying drawings. Herein, the thickness of layers and regions may be magnified in the accompanying drawings to clearly show the layers and the regions. Also, when a layer is described to be formed over a layer or a substrate, either the layer can be directly formed on the other layer or the substrate, or a third layer may be disposed therebetween. Furthermore, the same or like reference numerals denote the same or like elements even in different drawings.

FIGS. 3 to 7 are cross-sectional views illustrating a method for fabricating a semiconductor device including a capacitor in accordance with an embodiment of the present invention. Herein, FIGS. 3 to 7 illustrate the cross-sectional views taken along the direction that a bit line is vertically elongated.

As shown in FIG. 3, a plurality of gate structures 17 for access transistors are formed over a substrate 10 provided with a device isolation layer 11 through a shallow trench isolation (STI) or a local oxidation of silicon (LOCOS) process.

The gate structures 17 are formed in stack structures, each formed by sequentially stacking a gate oxide layer 12, a polysilicon layer 13 which is a gate conductive layer, a tungsten silicide layer 14 and a nitride-based hard mask 15.

A plurality of spacers 18 are formed over sidewalls of the gate structures 17 through a spacer formation process. Then, a source/drain ion-implantation process is performed to form a plurality of source/drain regions 19 in the substrate 10. Each of the spacers 18 is formed in a stack structure of oxide layer/nitride layer/oxide layer (ONO).

An insulation layer 20 is formed to fill empty spaces between the gate structures 17. Predetermined portions of the insulation layer 20 formed between the gate structures 17 are etched. Thereafter, openings over the substrate 10, exposed by the etching process of the insulation layer 20, are filled by using a conductive material to form a plurality of landing plugs 21.

A first inter-layer insulation layer 22 is formed over the above resulting structure including the landing plugs 21 and then, a bit line formation process is performed. For instance, the first inter-layer insulation layer 22 is etched to expose a predetermined portion of the landing plugs 21, the source/drain 19, and an upper portion of the predetermined gate structures 17 to form a plurality of first contact holes (not shown). Then, a material to form a bit line is formed over the height difference of the first inter-layer insulation layer 22 and the first contact holes (not shown). The material is patterned to form a bit line 27.

The material used to form the bit line 27 includes a diffusion barrier layer 23 with a stacked structure of titanium nitride (TiN) and titanium (Ti), a tungsten (W) layer 24 serving as a bit line conductive layer, and a first nitride layer 25 for a hard mask. Also, the first inter-layer insulation layer 22 is formed by using one selected from a group consisting of a high density plasma (HDP) oxide layer, a borophosphosilicate glass (BPSG) layer, a phosphosilicate glass (PSG) layer, a plasma enhanced tetraethylorthosilicate (TEOS) layer, a plasma enhanced chemical vapor deposition (PECVD) layer, an undoped silicate glass (USG) layer, a fluorinated silicate glass (FSG) layer, a carbon doped oxide (CDO) layer, an organic silicate glass (OSG) layer, and a combination thereof.

A second inter-layer insulation layer 28 is formed over the above resulting structure completed with the bit line formation process. Then, an etching process is performed by using a predetermined mask pattern to etch portions of the second inter-layer insulation layer 28 and the first inter-layer insulation layer 22.

A conductive material for a plug is formed to fill a plurality of second contact holes (not shown) formed from the above etching process and then, planarized to form a plurality of storage node contacts 29 which are contact plugs connected to the capacitor. The second inter-layer insulation layer 28 includes an oxide-based material such as the first inter-layer insulation layer 22.

A second nitride layer 30 for an etch stop is formed over the second inter-layer insulation layer 28 including the storage node contacts 29. Afterwards, a third inter-layer insulation layer 33 for forming a capacitor is formed over the second nitride layer 30. The third inter-layer insulation layer 33 includes an oxide-based material such as the second inter-layer insulation layer 28.

A photoresist layer (not shown) is formed over the third inter-layer insulation layer 33. Then, a photo-exposure process and a developing process are performed by using a photomask (not shown) to form a photoresist pattern (not shown) of which predetermined portions are exposed.

An etching process is performed by using the photoresist pattern as a mask to selectively etch the third inter-layer insulation layer 33 and the nitride layer 30 to expose the storage node contacts 29. As a result, a plurality of third contact holes (not shown) exposing the storage node contacts 29 are formed. A stripping process is performed to remove the photoresist pattern.

A plurality of bottom electrodes of the capacitor (i.e., storage nodes 35) are formed over internal surfaces of the third contact holes. For instance, the bottom electrode material of the capacitor (e.g., TiN) is formed over a height difference of the third inter-layer insulation layer 33 and the third contact holes. Afterwards, a planarization process such as etch-back is performed to form the bottom electrodes 35 of the capacitor only over the internal surfaces of the third contact holes.

The third inter-layer insulation layer 33 and the second nitride layer 30 between the bottom electrodes 35 of the capacitor are selectively etched and removed to form the bottom electrodes 35 of the cylinder type capacitor which are electrically isolated from the each other.

A dielectric layer 36 is formed over the height difference of the third inter-layer insulation layer 33 and the bottom electrodes 35 of the capacitor. Then a top electrode 37 of the capacitor is formed over the dielectric layer 36 to fill the third contact holes. The top electrode 37 includes TiN with a thickness of approximately 500 Å.

A mask process and an etching process are performed to selectively etch a predetermined portion of the top electrode 37 of the capacitor and the dielectric layer 36. As a result, a DRAM cell capacitor 39 is formed with the bottom electrode 35, the dielectric layer 36 and the top electrode 37. The bottom electrode 35 and the top electrode 37 include TiN in the present embodiment.

An amorphous silicon layer 40 having different etch selectivity from the top electrode 37 is formed over the top electrode 37 as a passivation layer to protect the top electrode 37 of the capacitor from a subsequent etching process. The amorphous silicon layer 40 is formed with a thickness of approximately 800 Å.

The amorphous silicon layer 40 can be replaced with a non-conductive polysilicon layer or a conductive silicon germanium (SiGe) layer.

A fourth inter-layer insulation layer 41 is formed over the amorphous silicon layer 40.

As shown in FIGS. 4 to 7, a metal contact formation process to transfer a signal to the top electrode 37 of the capacitor and the bit line 27 is performed. Particularly, the metal contact formation process is performed by a plurality of etch steps, e.g., four times. Different etch gases are used each etching process.

The first etching process uses an etch gas having a high etch selectivity to the amorphous silicon layer 40 as not to cause damage to the amorphous silicon layer 40. Accordingly, the first etching process etches an upper portion of the fourth inter-layer insulation layer 41 to a predetermined depth of the third inter-layer insulation layer 33. Herein, reference numerals 33A and 41A denote the patterned third inter-layer insulation layer and the patterned fourth inter-layer insulation layer, respectively. The second etching process etches a remaining portion of the patterned third inter-layer insulation layer 33A by using an etch gas having a high etch selectivity to the second nitride layer 30. The amorphous silicon 40 is etched to some extent, as explained below.

Herein, reference numeral 33B denotes the further patterned third inter-layer insulation layer. The third etching process uses an etch gas having a high etch selectivity to the amorphous silicon layer 40 again to etch the second nitride layer 30 up to the first nitride layer 25. Reference numerals 30A, 28A and 25A denote the patterned second nitride layer, the patterned second inter-layer insulation layer and the patterned first nitride layer, respectively. Then, an eighth contact hole 45E exposing the top electrode 37 is formed without causing damage in the top electrode 37 by using an etch gas having a high etch selectivity to TiN used to form the top electrode 37 during the fourth etching process.

The etch is finally stopped at the upper portion of the top electrode 37 during the etching processes to form the metal contact. Hence, a punch-through phenomenon typically generated in the top electrode 37 can be prevented. Accordingly, the contact area between the top electrode 37 and the metal contact is increased to reduce the contact resistance between the top electrode 37 and the metal contact.

Hereinafter, with reference to FIGS. 4 to 7, the metal contact formation process will be examined in detail.

Figure 4:
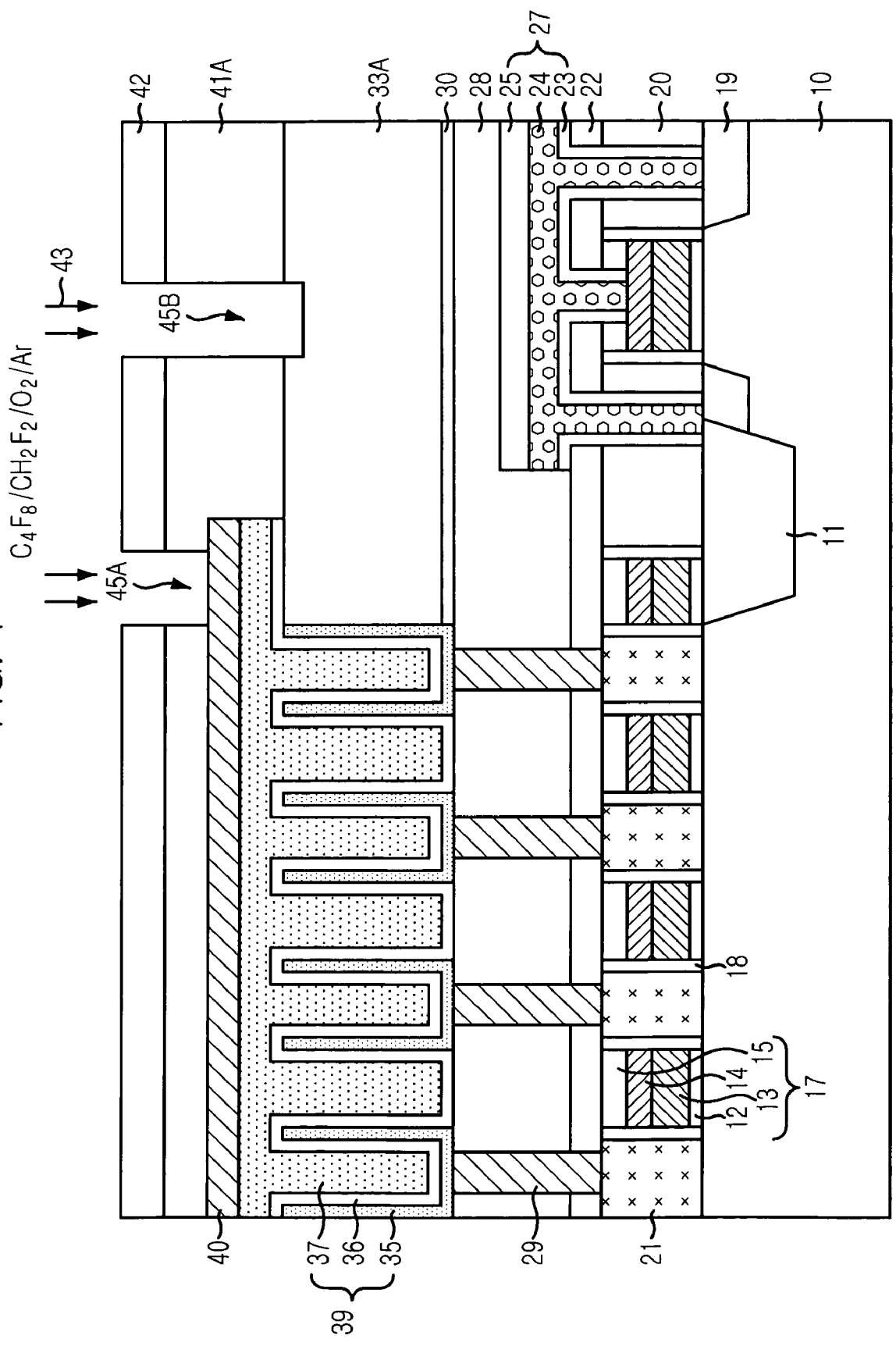

As shown in FIG. 4, a photoresist pattern 42, in which contact regions to form the metal contacts are exposed, is formed. The first etching process 43 is performed by using an etch gas including $CH_2F_2$ and having a high etch selectivity to the amorphous silicon layer 40 (i.e., a mixture gas including $C_4F_8$, $CH_2F_2$, $O_2$, and Ar) to form a fourth contact hole 45A and a fifth contact hole 45B.

During the first etching process 43 the etch is first stopped at an upper portion of the amorphous silicon layer 40, since the oxide-based fourth inter-layer insulation layer 41 is over etched with a ratio of approximately 30% or higher by using an etch gas including $CH_2F_2$ and having the high etch selectivity to the amorphous silicon layer 40. Not only the fourth inter-layer insulation layer 41, but also a predetermined portion of the third inter-layer insulation layer 33 is over etched with a predetermined depth in a region where the amorphous silicon layer 40 does not exist. The patterned third inter-layer insulation layer and the patterned fourth inter-layer insulation layer are denoted with reference numerals 33A and 41A, respectively. Herein, the first etching process 43 is performed for approximately 3 minutes to 5 minutes for the over etch. In one embodiment, the first etching process 43 is performed for approximately 4 minutes.

Figure 5:
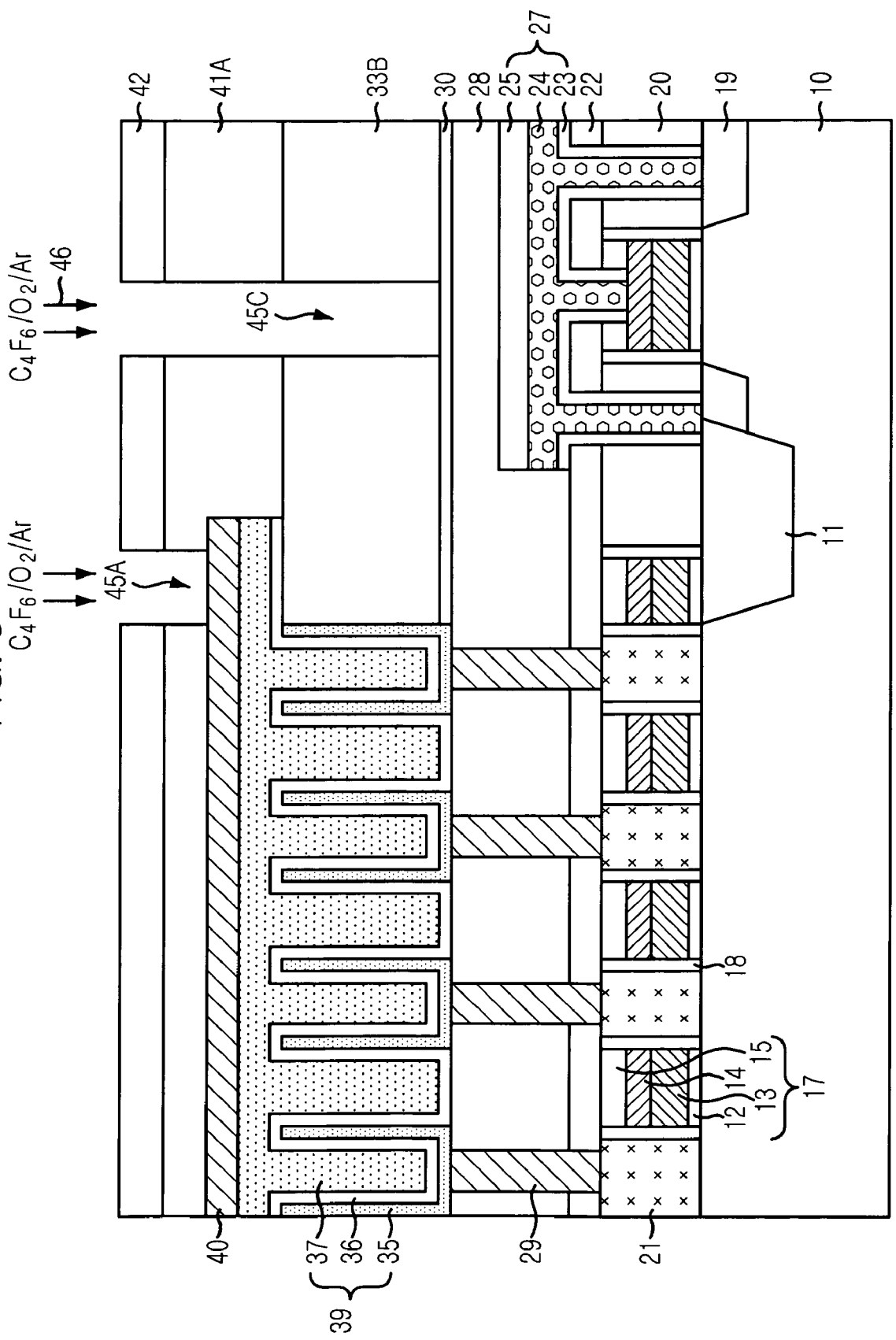

As shown in FIG. 5, during the second etching process 46, the patterned oxide-based third inter-layer insulation layer 33A exposed to a lower portion of the contact hole 45B is selectively etched by using an etch gas (i.e., a mixture gas including $C_4F_6$, $O_2$, and Ar) having a high etch selectivity to the second nitride layer 30. As a result, the etching process is stopped at an upper portion of the second nitride layer 30. Thus, a sixth contact hole 45C is produced. The second etching process is performed for approximately 2 minutes to 3 minutes. In one embodiment, the second etching process is performed for approximately 2 minutes and 30 seconds.

Since the second etching process 46 uses a mixture gas having a high etch selectivity to the second nitride layer 30, the second nitride layer 30 is not damaged, but the oxide-based patterned third inter-layer insulation layer 33A is etched. The further patterned third inter-layer insulation layer is denoted with a reference numeral 33B. Although not shown, the amorphous silicon layer 40 exposed to a lower portion of the contact hole 45A can be damaged to a predetermined thickness.

A cleaning process may be performed to remove polymers generated due to the first etching process 43 and the second etching process 46. The cleaning process is performed for approximately 10 seconds.

Figure 6:
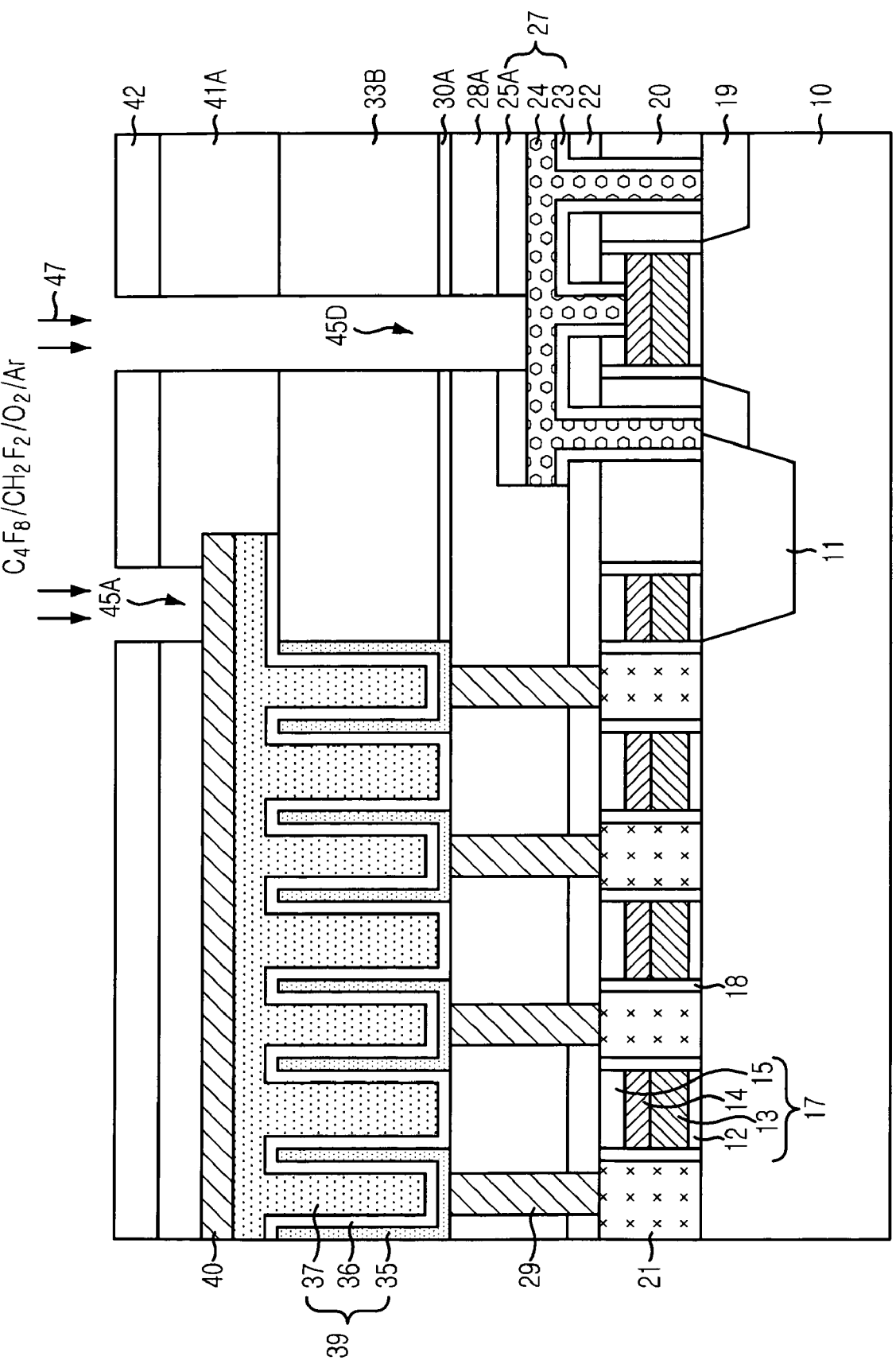

As shown in FIG. 6, the third etching process 47 uses an etch gas including $CH_2F_2$ having a high etch selectivity to the amorphous silicon layer 40. That is, during the third etching process 47, the second nitride layer 30 exposed to a lower portion of the sixth contact hole 45C, the second inter-layer insulation layer 28 and the first nitride layer 25 are etched by using a mixture gas including $C_4F_8$, $CH_2F_2$, $O_2$, and Ar. As a result, the tungsten layer 24 forming the bit line 27 is exposed, and the sixth contact hole 45C shown in FIG. 5 becomes a seventh contact hole 45D which is much deeper. Reference numerals 30A, 28A and 25A denote the patterned second nitride layer, the patterned second inter-layer insulation layer, and the patterned first nitride layer, respectively. Herein, the third etching process 47 is performed for approximately 1 minute to 2 minutes. The third etching process 47 is performed for approximately 1 minute and 30 seconds in one implementation.

During the third etching process 47, since the mixture gas having a high etch selectivity to the amorphous silicon layer 40 is used, the amorphous silicon layer 40 exposed by the fourth contact hole 45A is not damaged but the surrounding insulation layers are etched.

Figure 7:
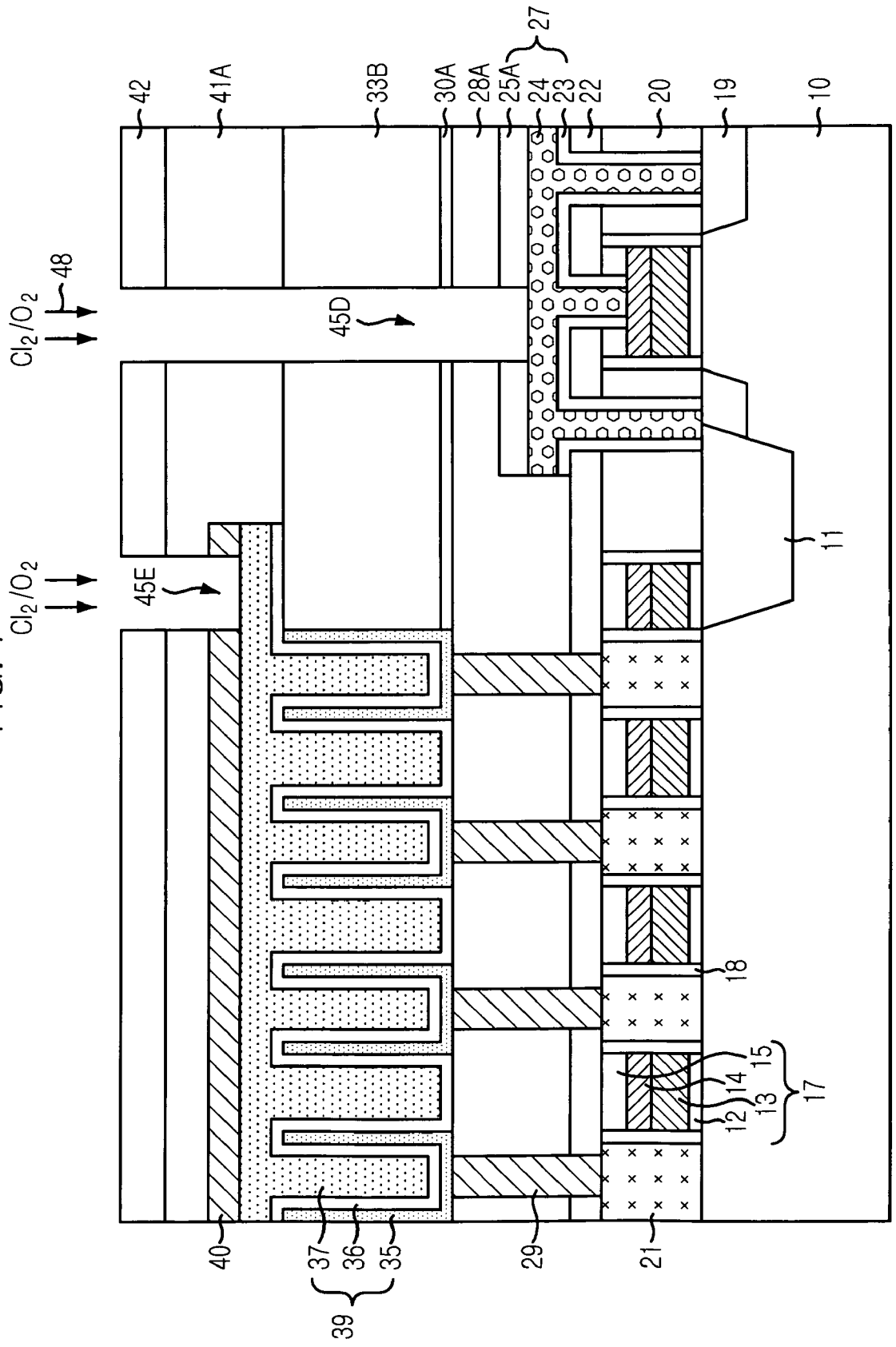

As shown in FIG. 7, during the fourth etching process 48, the amorphous silicon layer 40 exposed to the lower portion of the fourth contact hole 45A is selectively etched by using an etch gas (i.e., a mixture gas including chlorine ($Cl_2$) and $O_2$) having a high etch selectivity to TiN such as the metal forming the top electrode 37 of the capacitor. The etch is stopped at the upper portion of the top electrode 37 of the capacitor. Accordingly, the eighth contact hole 45E is formed.

Through the above four etching processes, a punch-through phenomenon can be prevented in the top electrode 37 of the capacitor. Accordingly, the contact resistance is also reduced between the top electrode 37 and the final metal contact (not shown, to be formed through a subsequent process) thereby improving yield.

Figure 8A:
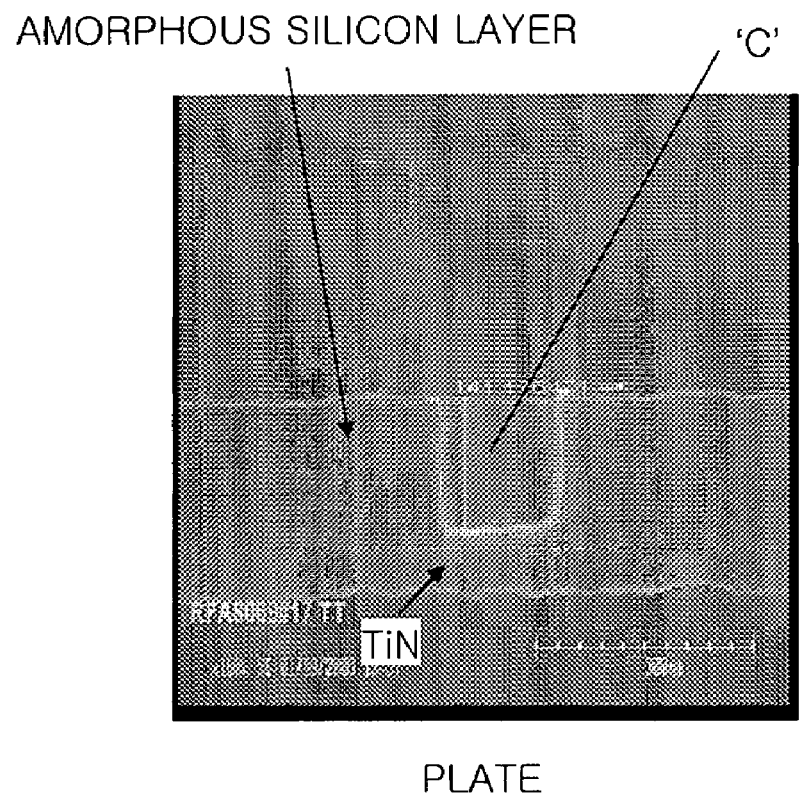
FIGS. 8A and 8B are SEM micrographs illustrating a semiconductor device including a capacitor in accordance with an embodiment of the present invention.
Figure 8B:
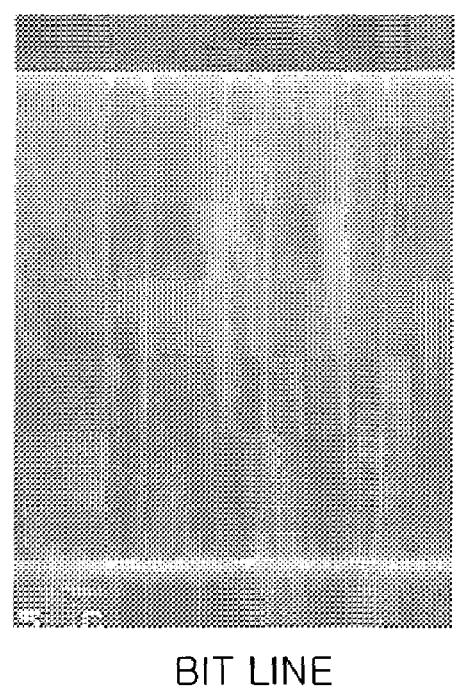

FIGS. 8A and 8B are SEM micrographs illustrating the semiconductor device including the capacitor in accordance with an embodiment of the present invention. FIG. 8A illustrates a portion where a top electrode is exposed, and FIG. 8B illustrates a portion where a bit line is exposed.

Referring to FIGS. 8A and 8B, a contact hole 'C' is formed only in an amorphous silicon layer formed over TiN which is the material used to form the top electrode. That is, during forming the contact hole 'C' to form the final metal contact, a punch-through phenomenon cannot be formed in TiN which is the top electrode of the capacitor. Also, damage cannot be generated in the top electrode since the etch is stably stopped at an upper portion of the top electrode.

According to this embodiment of the present invention, an amorphous silicon layer or polysilicon layer, and a mixture gas including $C_4F_6$, $CH_2F_2$, $O_2$ and Ar are properly used during etching processes to form a final metal contact. Accordingly, the polysilicon layer can be minimally damaged, thus preventing a punch-through phenomenon typically generated in the top electrode of the capacitor while a subsequent etching process is performed.

Furthermore, the amorphous silicon layer existing on the top electrode is etched by using a mixture gas including $Cl_2$ and $O_2$ having a high etch selectivity to the top electrode after the top surface of the bit line is exposed. Accordingly, the etch is stopped over the top electrode of the capacitor to prevent damage in the top electrode of the capacitor.

Accordingly, the contact area between the top electrode and the final metal contact is increased to reduce the contact resistance between the top electrode and the final metal contact. Furthermore, it is possible to improve yield of the semiconductor device.

The present application contains subject matter related to the Korean patent application No. KR 2006-0049007, filed in the Korean Patent Office on May 30, 2006, the entire contents of which are incorporated herein by reference.

While the present invention has been described with respect to certain embodiments, it will be apparent to those skilled in the art that various changes and modifications may be made without departing from the spirit and scope of the invention as defined in the following claims.

What is claimed is:

1. A method for fabricating a semiconductor device, comprising:
   providing a substrate structure including a bit line and a capacitor formed apart from each other at a different level;
   forming first, second, and third insulation layers over the bit line, the second insulation layer being a first etch stop layer;
   forming a second etch stop layer over a top electrode of the capacitor;
   forming a fourth insulation layer over the third insulation layer and the second etch stop layer; and
   performing a plurality of etch steps to expose an upper surface of the bit line and an upper surface of the capacitor.

2. The method of claim 1, wherein the performing of the plurality of etch steps includes:
   performing a first etch step to etch the fourth insulation layers, the first etch step exposing a portion of the second etch stop layer and a portion of the third insulation layer;
   performing a second etch step to etch the exposed portion of the third insulation layer, the second etch step exposing a portion of the first etch stop layer;
   performing a third etch step to etch the exposed portion of the first etch stop layer, the third etch step exposing the upper surface of the bit line; and
   performing a fourth etch step to etch the exposed portion of the second etch stop until the upper surface of the capacitor is exposed.

3. The method of claim 2, wherein the four etch steps are performed using the same etch mask.

4. The method of claim 2, wherein the first, third, and fourth insulation layers each includes an oxide-based material, wherein at least one etching step uses a mixture gas of $C_4F_8$, $CH_2F_2$, $O_2$, and Ar.

5. The method of claim 1, wherein the plurality of etch steps are performed using the same etch mask.

6. The method of claim 1, wherein the second etch stop layer includes one selected from a group consisting of an amorphous silicon layer, a non-conductive polysilicon layer and a conductive silicon germanium layer.

7. The method of claim 1, wherein the upper surface of the capacitor includes titanium nitride (TiN), wherein the second etch stop layer is etched using a mixture gas of $Cl_2$ and $O_2$.

8. A method for fabricating a semiconductor device, comprising:
   providing a substrate structure including a bit line and a capacitor formed apart from each other at a different level, wherein first, second, and third insulation layers are formed over the bit line, the second insulation layer being a first etch stop layer;
   forming a second etch stop layer over a top electrode of the capacitor;
   forming a fourth insulation layer over the third insulation layer and the second etch stop layer;
   etching the fourth insulation layer to expose a portion of the second etch stop layer and a portion of the third insulation layer;
   etching the third insulation layer until the first etch stop layer is exposed;
   etching the first etch stop layer and the first insulation layer until an upper surface of the bit line is exposed using an etch gas having high selectivity to the second etch stop layer; and
   etching the second etch stop layer until the top electrode is exposed using an etch gas having high selectivity to the top electrode.

9. The method of claim 8, wherein the second etch stop layer includes one selected from a group consisting of an amorphous silicon layer, a non-conductive polysilicon layer, and a conductive silicon germanium layer.

10. The method of claim 9, wherein each of the first, third, and fourth insulation layers includes an oxide-based material.

11. The method of claim 10, wherein the etching of the fourth insulation layer and the etching of the first insulation layer each uses a mixture gas of $C_4F_8$, $CH_2F_2$, $O_2$, and Ar.

12. The method of claim 11, wherein the etching of the fourth insulation layer comprises over etching the fourth insulation layer with an over etching ratio of approximately 30% or higher.

13. The method of claim 10, wherein the first etch stop layer includes a nitride-based material.

14. The method of claim 13, wherein the etching of the third insulation layer uses a mixture gas of $C_4F_6$, $O_2$, and Ar.

15. The method of claim 9, wherein the top electrode includes TiN.

16. The method of claim 15, wherein the etching of the second etch stop layer comprises using a mixture gas of $Cl_2$ and $O_2$.

17. The method of claim 16, wherein the etching of the fourth insulation layer, the etching of the third insulation layer, the etching of the first insulation layer, and the etching of the second etch stop layer are all done using the same etch mask.

18. The method of claim 16, further comprising a cleaning process after the etching of the third insulation layer.

* * * * *